United States Patent
Abys et al.

(10) Patent No.: US 6,730,209 B2
(45) Date of Patent: May 4, 2004

(54) SOLDER ELECTROPLATING BATH INCLUDING BRIGHTENERS HAVING REDUCED VOLATILITY

(75) Inventors: Joseph A. Abys, Howell, NJ (US); Frank Stanley Humiec, Fair Lawn, NJ (US); Kenneth J. Murski, West Milford, NJ (US); Yun Zhang, Warren, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/081,326

(22) Filed: Feb. 22, 2002

(65) Prior Publication Data

US 2003/0159939 A1 Aug. 28, 2003

(51) Int. Cl.⁷ .............................. C25D 3/60; C25D 3/34; C25D 3/32; C23C 16/00; C23C 18/00
(52) U.S. Cl. ........................ 205/253; 205/254; 205/299; 205/302; 106/1.25; 106/1.27
(58) Field of Search ................................ 106/1.25, 1.27; 205/253, 254, 299, 302

(56) References Cited

U.S. PATENT DOCUMENTS 5,021,130 A * 6/1991 Metzger et al. .............. 205/254
2002/0153260 A1 * 10/2002 Egli et al. .................... 205/300

FOREIGN PATENT DOCUMENTS

CN           1224083 A  *  7/1999  ............ C25D/3/36

OTHER PUBLICATIONS

Abstract only.*

* cited by examiner

*Primary Examiner*—Edna Wong

(57) ABSTRACT

In accordance with the invention, the volatility of a solder plating bath with volatile brighteners such as aldehydes has its volatility reduced by the addition of diols to the bath. The diols are advantageously 1,3 propanediol or 1,2 propanediol and are accompanied by lower molecular weight alcohols. In a preferred embodiment, a diol along with low alcohol is added to a bath comprising sulfonic acid, surfactant, grain refiner and brightening agents comprising an aromatic aldehyde and a carboxylic acid.

17 Claims, No Drawings

SOLDER ELECTROPLATING BATH INCLUDING BRIGHTENERS HAVING REDUCED VOLATILITY

FIELD OF THE INVENTION

This invention relates to an aqueous electroplating solution for high speed electroplating bright tin and tin-lead alloy solder coatings, and in particular, to an electroplating solution using volatile aldehyde brighteners and added diols to keep the aldehyde in solution.

BACKGROUND OF THE INVENTION

Electroplated tin and tin/lead alloy solder coatings are used extensively in the electronics industry in the manufacture of printed wiring boards (PWB), electrical contacts and connectors, semiconductor packaging, electrical conduits, and other related parts. These plated solder coatings must be pore free or corrosion resistant, display long term solderability and be free from solderability failures such as non-wetting and dewetting.

Bright plated solder coatings have distinct advantages over plated solder coatings with matte and satin bright finishes. Bright plated coatings, for example, are more readily subject to on-line automatic inspection. They are less likely to have plating stains and are cosmetically superior. Until recently, however, bright plated coatings with satisfactory solderability could be achieved only at low current densities, reducing the plating speed and profitability of bright plated parts.

U.S. Pat. No. 6,267,863 which issued to J. A. Abys et al. on Jul. 31, 2001 discloses a new electroplating solution for plating bright tin, lead or tin-lead alloy solder coatings at high speed. This application is incorporated herein by reference. The new solution comprises a sulfonic acid electrolyte, a non-ionic surfactant, a grain refiner and brightening agents comprising an aromatic aldehyde and a carboxylic acid. The new solution permits production of bright tin or tin-lead alloy solder coatings having very low organic (carbon) content at current densities as high as 1300 ASF. The result is high speed production of bright plated solder coatings with excellent reflowability and solderability.

One drawback of this process is that aldehyde brighteners are volatile. To prevent evaporative loss of the brighteners, the plating must be carried out at a reduced temperature, typically about 58° F. This necessitates the use of chillers, which are expensive and inconvenient. Accordingly it would be desirable to provide a less volatile bright solder plating bath so that plating can be carried out at room temperature and above.

SUMMARY OF THE INVENTION

In accordance with the invention, the volatility of a solder plating bath with volatile brighteners such as aldehydes has its volatility reduced by the addition of diols to the bath. The diols to the bath. The diols are advantageously 1, 3 propanediol or 1, 2 propanediol and are accompanied by lower molecular weight alcohols. In a preferred embodiment, a diol along with low alcohol is added to a bath comprising sulfonic acid, surfactant, grain refiner and brightening agents comprising an aromatic aldehyde and a carboxylic acid.

DETAILED DESCRIPTION

Bright plated solder coatings are achieved in the present invention using a tin or tin/lead electroplating solution based upon an alkane or alkanol sulfonic acid electrolyte which includes certain brightening additives that interact synergistically during electroplating to produce bright tin or tin-lead alloy solder coatings having very low organic (carbon) content at current densities as high as 1300 ASF. As should be apparent, the low organic content in the bright plated solder coatings is advantageous in providing the coatings with excellent reflowability and solderability.

The very low organic content in bright solder coating plated using the electroplating solution of the present invention makes them very useful in high speed continuous electroplating applications such as connectors, IC lead frames and other electronic components. The ability to achieve such low organic content at high current densities advantageously permits use of the electroplating solution in these high speed electroplating applications where high throughput and high productivity are possible.

The brightening additives used in the inventive electroplating solution consist of an aromatic aldehyde and a carboxylic acid. The aromatic aldehyde also functions as a leveling agent to improve the smoothness of the plated surface. The synergistic interaction of these two additives produces bright tin or tin-lead alloy solder coatings with very low organic content at relatively high current densities as shown in the above Table.

Some of the aromatic aldehydes which are useable in the electroplating solution include chlorobenzaldehyde, methoxybenzaldehyde, the allyl ether of 2-hydroxybenzaldehyde, and the derivatives of benzaldehyde which contain an electron donating group on the benzene ring. Some of the carboxylic acids which are useable in the electroplating solution of the invention include methacrylic acid, acrylic acid and their derivatives. In one embodiment, the aromatic aldehyde comprises chlorobenzaldehyde and the carboxylic acid comprises methacrylic acid.

To improve the dispersibility of the solution and suppress the growth of dendrites, a non-ionic surfactant and a grain refiner are added to the solution. The non-ionic surfactant improves the dispersibility of the solution and also ensures that the plated solder coatings adhere well to the underlying substrate. The grain refiner suppresses the growth of dendrites. Examples of suitable non-ionic surfactants include aromatic compounds such as substituted and unsubstituted phenyl and phenol compounds. Examples of suitable grain refiners include heterocyclic compounds such as substituted and unsubstituted lactones, cyclic imides, and oxazolines. In one embodiment, the non-ionic surfactant comprises a polyalkoxylated alkyl phenol, such as octylphenoxy (10) polyethoxy ethanol and the grain refiner comprises phenolphthalein.

To prevent evaporative loss of the brighteners, diols are added to the bath. The diols remain in the solution and they also keep the volatile brighteners in the solution. The aldehyde phase does not separate and does not evaporate as readily as in prior practice. In one embodiment the diol is 1, 3 propanediol or 1, 2 propanediol and it is advantageously accompanied by lower molecular weight alcohols.

The alkane or alkanol sulfonic acid electrolyte used in the solution should be water soluble or soluble in the solution. Suitable sulfonic acids include the lower alkane or alkanol sulfonic acids containing 1–5 carbon atoms. In one embodiment, the sulfonic acid electrolyte comprises methanesulfonic acid.

The tin and/or lead compounds typically used in the solution are those which are soluble in alkane or alkanol sulfonic acids and form an alkane or alkanol sulfonic acid salt. However, the tin and/or lead metals can be added to the baths in various forms and do not have to be added as a soluble alkane or alkanol sulfonate salt. Lead, for example, can be added as lead acetate. Thus, the solution can contain ions other than sulfonate ions as long as sufficient sulfonate ions are present to produce the advantages results of the invention. The metals should predominate as sulfonates in the baths.

A solution for electroplating a tin-lead alloy is typically prepared by adding about 70–90 g/l of the stannous sulfonate and about 8–12 g/l of the lead sulfonate to about 175–225 ml of the methanesulfonic acid. (A solution for electroplating either tin or lead can be prepared in the same manner by respectively omitting the lead or stannous sulfonate). To this solution are added about 2–2.25 g/l of octylphenoxy (10) polyethoxy ethanol, about 0.08–0.12 g/l of phenolphtalein, about 0.1–0.25 g/l of chlorobenzaldehyde, about 0.8–1.2 g/l of methacrylic acid, and about 1–2 g/l of propanediol (1,3 or 1,2).

After the solution is prepared, it can then be used in a high speed electroplating process for electroplating tin-lead alloy onto a metal substrate by placing the metal substrate in a electroplating solution equipped with a soluble tin anode. The electroplating solution is maintained at a temperature in the range of about room temperature to about 35 degrees C. The current densities used for electroplating are typically about 1300 ASF or less.

The substrate is maintained in the solution under the above conditions for a period of time that is sufficient to plate the substrate with a tin coating of a desired thickness. Typically, it is advantageous if the tin coating has a thickness of about 3 mu.m to about 6 mu.m.

EXAMPLE

A solution was prepared by adding 80 grams of stannous methane sulfonate and 10 grams of lead methyl sulfonate to one liter of an aqueous solution containing 200 ml of a 70 percent methane sulfonic acid. To this solution was added about 2 g/l of octylphenoxy (10) polyethoxy ethanol (commercially available under the tradename Triton X-100.RTM. from Union Carbide), about 0.08 g/l of phenolphthalein (commercially available from Fischer Scientific Co.) about 0.25 g/l of chlorobenzaldehyde (available from Aldrich), and about 1 g/l of methacrylic acid (available from Aldrich), and about 1.5 g/l of propanediol. The resulting solution was then used to plate a layer of tin-lead alloy on a substrate of copper, copper alloy or steel. The chlorobenzaldehyde did not separate and plating was carried out at room temperature and above.

While the foregoing invention has been described with reference to the above embodiments, various modifications and changes may be made without departing from the spirit of the present invention. Accordingly, modifications and changes such as those suggested above but not limited thereto are considered to be within the scope of the claims.

What is claimed is:

1. An electroplating solution useable for plating tin, lead or tin-lead alloy solder coatings comprising:
    a sulfonic acid electrolyte;
    at least one of a tin sulfonate salt or a lead sulfonate salt;
    a non-ionic surfactant comprising an aromatic compound;
    a grain refiner comprising a heterocyclic compound;
    at least one brightening agent that is volatile at room temperature, and
    at least one alkyl diol for reducing the volatility of the bath.
2. The electroplating solution of claim 1, wherein the brightening agent comprises an aromatic aldehyde.
3. The electroplating solution of claim 2, wherein the aromatic aldehyde is selected from the group consisting of chlorobenzaldchyde, methoxybenzaldehyde, the allyl ether of 2-hydroxybenzaldehyde, and derivatives of benzaldehyde which contain an electron donating group on the benzene ring.
4. The electroplating solution of claim 2, wherein the aromatic aldehyde is chlorobenzaldehyde.
5. The electroplating solution of claim 1, wherein the aromatic compound is a polyalkoxylated alkyl phenol.
6. The electroplating solution of claim 1, wherein the aromatic compound is octylphenoxy (10) polyethoxy ethanol.
7. The electroplating solution of claim 1 wherein the heterocyclic compound is selected from the group consisting of substituted and unsubstituted lactones, cyclic imides, and oxazollines.
8. The electroplating solution of claim 1, wherein the heterocyclic compound is phenolphthalein.
9. The electroplating solution of claim 1, wherein the brightening agent comprises carboxylic acid.
10. The electroplating solution of claim 9, wherein the carboxylic acid is methacrylic acid.
11. The electroplating solution of claim 1, wherein the sulfonic acid electrolyte is selected from the group consisting of alkane sulfonate and alkanol sulfonate.
12. The electroplating solution of claim 1, wherein the at least one of a tin sulfonate salt and a lead sulfonate salt comprises a tin sulfonate salt and a lead sulfonate salt.
13. The electroplating solution of claim 1, wherein the alkyl dial comprises propanediol.
14. The electroplating solution of claim 13, wherein the propanediol comprises 1,3-propanediol or 1,2-propanediol.
15. A process for electroplating a substrate with tin, lead or tin-lead alloys comprising the steps of:
    providing an electroplating solution comprising a sulfonic acid electrolyte; at least one of a tin sulfonate salt or a lead sulfonate salt; a non-ionic surfactant comprising an aromatic compound; a grain refiner comprising a heterocyclic compound; brightening agents consisting essentially of an aromatic aldehyde and a carboxylic acid; and an alkyl diol;
    positioning the substrate in the electroplating solution;
    applying current; and
    maintaining the temperature of the electroplating solution at a sufficiently high temperature so that the substrate is electroplated with a bright solder coating having a carbon content of less than about 0.1%.
16. The process of claim 15, wherein the alkyl dial comprises propanediol.
17. The process of claim 16, wherein the propanediol comprises, 1,3-propanediol or 1,2-propanediol.

* * * * *